United States Patent [19]
Kim et al.

[11] Patent Number: 6,165,900
[45] Date of Patent: Dec. 26, 2000

[54] METHOD FOR MANUFACTURING SEMICONDUCTOR DEVICE

[75] Inventors: Ki-Joon Kim, Seoul; Jong-mil Youn; Sung-Bong Kim, both of Kyonggi-do, all of Rep. of Korea

[73] Assignee: Samsung Electronic Co., Ltd., Suwon, Rep. of Korea

[21] Appl. No.: 09/233,482

[22] Filed: Jan. 20, 1999

[30] Foreign Application Priority Data

Jan. 20, 1998 [KR] Rep. of Korea .......................... 98/1526

[51] Int. Cl.[7] .................. H01L 21/8244; H01L 21/4763
[52] U.S. Cl. .......................... 438/649; 438/238; 438/655; 438/682
[58] Field of Search .............................. 438/238, 647–685

[56] References Cited

U.S. PATENT DOCUMENTS

5,187,122  2/1993  Bonis .
5,946,565  8/1999  Ikeda et al. .............................. 438/238

*Primary Examiner*—Jey Tsai
*Attorney, Agent, or Firm*—Jones Volentine, L.L.C.

[57] ABSTRACT

A semiconductor device manufacturing method is provided. In this method for interconnecting conductive layers, an insulating layer is formed over the surface of a semiconductor substrate having conductive layers formed thereon. The insulating layer is removed from over the conductive layers and a silicon layer is coated on the overall surface of the resultant structure. The insulating layer and some silicon are then removed from an area except for the area from a first conductive layer through a second conductive layer, and a refractory metal layer is formed on the overall surface of the resultant structure. This refractory metal is used for silicidation. A metal silicide layer is then formed from the first conductive layer through the second conductive layer by thermally treating the refractory metal layer.

18 Claims, 6 Drawing Sheets

METHOD FOR MANUFACTURING SEMICONDUCTOR DEVICE

This application relies for priority upon Korean Patent Application No. 98-1526, filed on Jan. 20, 1998, the contents of which are herein incorporated by reference in their entirety.

FIELD OF THE INVENTION

The present invention relates to a method for manufacturing a semiconductor device, and in particular, to a method for manufacturing a semiconductor device in which a silicide is formed to electrically connect a transistor with another circuit element.

DESCRIPTION OF THE RELATED ART

Since the emergence of more highly integrated semiconductor devices, there has been an increasing demand for more improved interconnection technology that can satisfy electrical characteristic requirements and ensure an adequate process margin in a narrow area in interconnecting elements that constitute a semiconductor device.

In a static random access memory (SRAM) device, a unit memory cell includes four or six transistors. Such an SRAM device requires an effective interconnection technique to increase an integration level and ensure excellent memory characteristics. Conventionally, so-called "butted contacts" using a polysilicon plug or a tungsten plug, and a metal layer of titanium silicide or tungsten have been employed as an interconnection between elements.

In a method for connecting a transistor with another element by a titanium nitride (TiN) according to the latter interconnection technique, a silicide-forming refractory metal layer such as a titanium layer is deposited on the transistor and a polysilicon layer is disposed on a field oxide film. Then, the resultant structure is subjected to a thermal treatment in a nitrogen ($N_2$) atmosphere, thereby forming a titanium silicide on the area where silicon is in contact with titanium. In other words, titanium silicide is formed on the gate electrode and source/drain regions of the transistor and the polysilicon layer. On the silicon-free area, a compound of titanium and nitrogen, i.e., titanium nitride, is formed. Subsequently, a photoresist film is formed only on the area from a diffusion region of the resultant structure through the polysilicon layer and etching is performed. As a result, the conductive titanium nitride exists between the diffusion region and the polysilicon layer, electrically connecting them.

However, the conventional method has a problem, given the difficulties involved in optimizing process conditions. This problem results because photolithography using a photoresist film should be performed to leave the titanium nitride between the diffusion region and the polysilicon layer to interconnect them, but should be done without damaging the preexistent titanium silicide on the diffusion region and the polysilicon layer.

In another interconnection method using a silicide to connect a transistor with another element, a silicide-forming refractory metal layer such as a titanium layer and an amorphous silicon layer are sequentially deposited over a transistor formed on a silicon substrate and a polysilicon layer formed on a field oxide film. Thereafter, a photoresist film is formed only on the area from a diffusion region of the transistor through the polysilicon layer and amorphous silicon is removed from the photoresist film-free area by etching. The resultant structure is then subjected to thermal treatment in a nitrogen atmosphere and, as a result, a silicide is formed on the area where titanium is in contact with amorphous silicon. In other words a silicide is formed on the diffusion region, a gate electrode, and the area from the diffusion region through the polysilicon layer.

The above conventional method obviates the need for photolithograph, which is performed to leave titanium nitride to electrically connect the diffusion region with the polysilicon layer, but incurs the difficulty of depositing amorphous silicon on titanium and removing amorphous silicon from the photoresist film-free area without damaging the titanium.

Therefore, there is an ever increasing need for an interconnection method that can overcome the difficulties involved in fine patterning and deposition and the removal of a silicon layer necessary to form a silicide layer.

SUMMARY OF THE INVENTION

An object of the present invention is to provide a method for manufacturing a semiconductor device that can overcome the above conventional problems.

To achieve the above object, there is provided a semiconductor device manufacturing method. In this method, first and second transistors are formed on an active region of a semiconductor substrate, the first and second transistors being adjacent to each other. An insulating layer is formed over the semiconductor substrate and the first and second transistors. The insulating layer is removed from over a diffusion region of the first transistor and over a gate of the second transistor. A silicide-forming silicon is then coated over the semiconductor substrate, the insulating layer, and the first and second transistors. A photoresist film is formed over a first area from the diffusion region of the first transistor to the gate of the second transistor, and exposed portions of the silicide-forming silicon and the insulating layer not in the first area are removed. The photoresist film is then removed and a metal layer is formed over the semiconductor substrate, the insulating layer, and the first and second transistors. A silicide layer is then formed in the first area by thermally treating the metal layer, after which any remaining unreacted metal layer is removed. In this way, the diffusion region of the first transistor is connected to the gate of the second transistor by the silicide layer.

The diffusion region of the first transistor is preferably a drain region. The step of removing an insulating layer may also remove an insulating layer from over a source region of the first transistor. The first area may also include an area over the source region of the first transistor.

The gate of the second transistor is preferably a polysilicon layer formed over a field oxide film. The insulating layer is preferably chosen from the group consisting of an oxide film and a nitride film. The metal layer is preferably formed of a refractory metal selected from the group consisting of titanium, tungsten, cobalt, and molybdenum.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

FIGS. 1A to 1E are sectional views sequentially illustrating a semiconductor device manufacturing process according to a first preferred embodiment of the present invention.

Figure 1A:
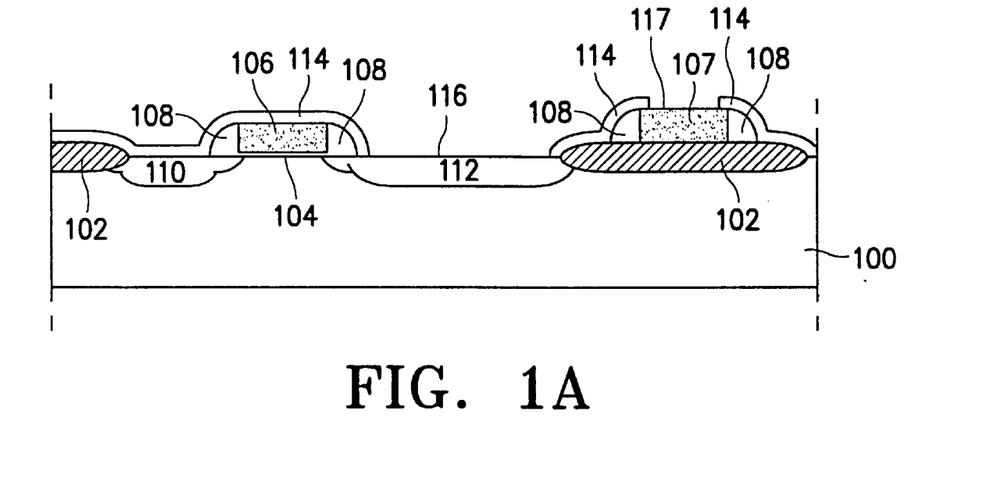
FIGS. 1A to 1E are sectional views sequentially illustrating a semiconductor device manufacturing process according to a first preferred embodiment of the present invention.

FIG. 1A illustrates the step of forming an insulating layer 114 over a semiconductor substrate 100 having a transistor, which includes gate, source, and drain regions 106, 110, and 112, and a polysilicon layer 107 formed thereon. An active region is defined on the semiconductor substrate 100 by a device isolation film 102. Then, the gate region 106 of the transistor is formed to a thickness of about 300 nm with the interposition of a gate insulating layer 104 over the active region of the semiconductor substrate 100. The polysilicon layer 107 is formed over the device isolation film 102 to connect with another device. Alternatively, the polysilicon layer 107 may be used as a gate that is part of an adjacent transistor (not shown in FIG. 1A) spaced apart from a transistor having a gate region 106. Then, spacers 108 are formed on the sidewalls of the gate region 106 and the polysilicon layer 107. Preferably, the spacers 108 are formed of nitride in order to prevent the gate region 106 and the polysilicon layer 107 from being damaged in a subsequent oxide film etching step.

The source and drain regions 110 and 112 are formed by performing ion implantation on the semiconductor substrate 100 with the gate region 106 and the device isolation film 102 used as an ion-implanting mask. Thereafter, the insulating layer 114, for example, an oxide or nitride film is formed over the overall surface of the resultant structure and is removed from above the drain region 112 and the polysilicon layer 107. Thus, the top surfaces 116 and 117 of the drain region 106 and the polysilicon layer 107, respectively, are exposed. The drain region 112 is to be connected with the polysilicon layer 107 by forming a silicide layer over their exposed surfaces 116 and 117 and the area between the two during a subsequent step.

Figure 1B:
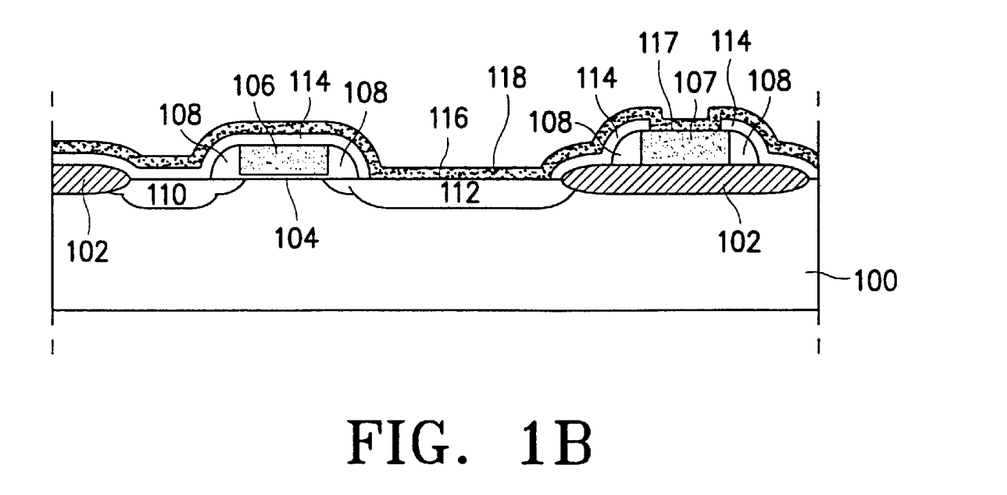

FIG. 1B illustrates the step of depositing a silicon layer 118 over the overall surface of the semiconductor substrate 100, which has the insulating layer 114 partially removed. The impurity-doped silicon layer 118 is formed over the exposed surfaces 116 and 117, and over the remaining insulating layer 114. The silicon layer 118 is preferably formed of single crystalline silicon, polysilicon, or amorphous silicon.

Figure 1C:
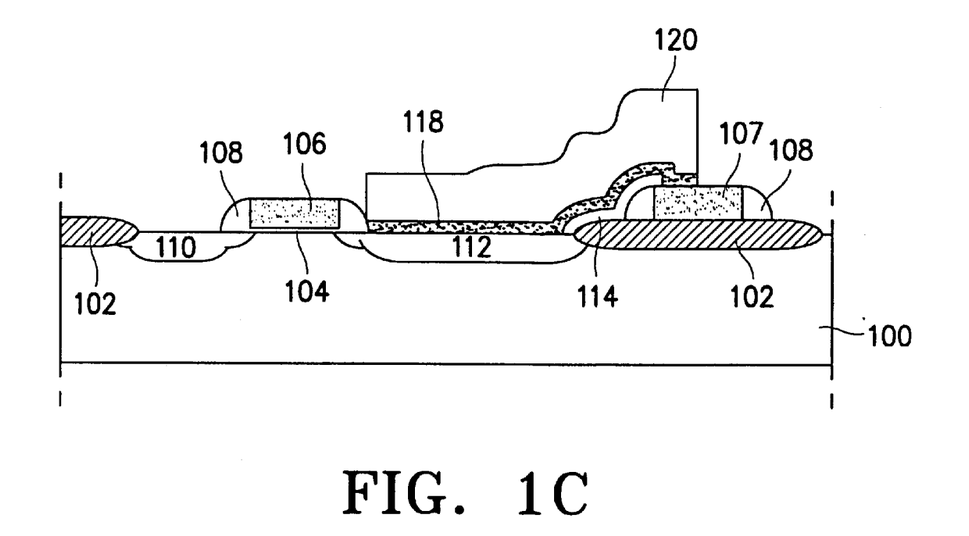

FIG. 1C illustrates the step of forming a photoresist film 120 over the area from the drain region 112 through a portion of the polysilicon layer 107 and removing the polysilicon layer 118 and the insulating layer 114 from the photoresist film-free area. The photoresist film 120 is preferably coated over the overall surface of the semiconductor substrate 100 and is then patterned to remain only over the area from the drain region 112 through a portion of the polysilicon layer 107. With the patterned photoresist film 120 used as a self-aligned etching mask, the silicon layer 118 and the insulating layer 114 are removed from the photoresist film-free area.

Figure 1D:
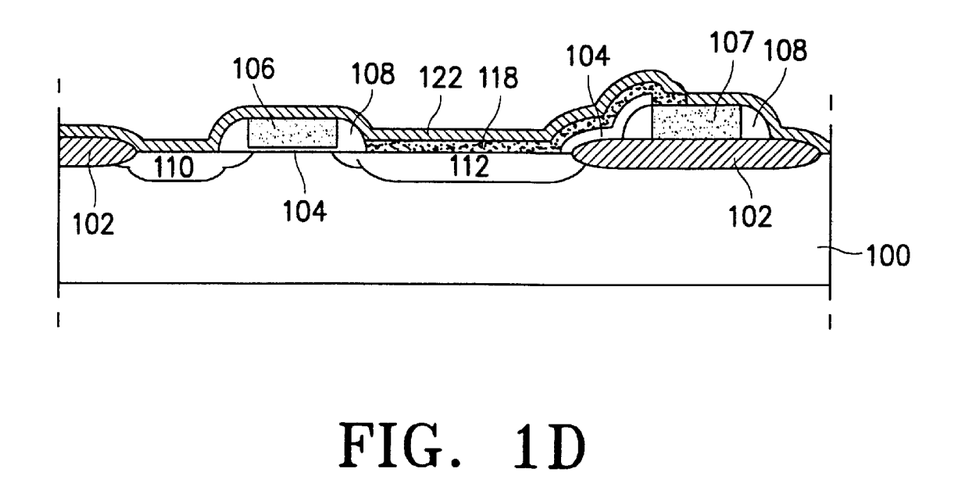

FIG. 1D illustrates the step of forming a titanium layer 122 over the overall surface of the semiconductor substrate 100. After the patterned photoresist film 120 is entirely removed, a silicide-forming refractory metal layer, for example, a titanium layer 122 is formed over the overall surface of the semiconductor substrate 100. Here, titanium may be replaced with another refractory metal such as cobalt (Co), tungsten (W), or molybdenum (Mo). When a silicide is formed from the reaction between one of these refractory metals and silicon, more silicon is consumed than the metal. For example, when forming a titanium silicide layer, the silicon layer 118 should be about 2 to 2.3 times thicker than the titanium layer 122. Thus, assuming that the titanium layer 122 is about 20 nm thick, the silicon layer 118 should be preferably about 40 through 44 nm thick.

On the other hand, when forming a cobalt silicide layer, silicon is consumed about 3.2 to 3.4 times more than cobalt. Therefore, the thickness of the silicon layer 118 should be preferably about 64 to 68 nm for a cobalt layer of about 20 nm thickness.

Figure 1E:
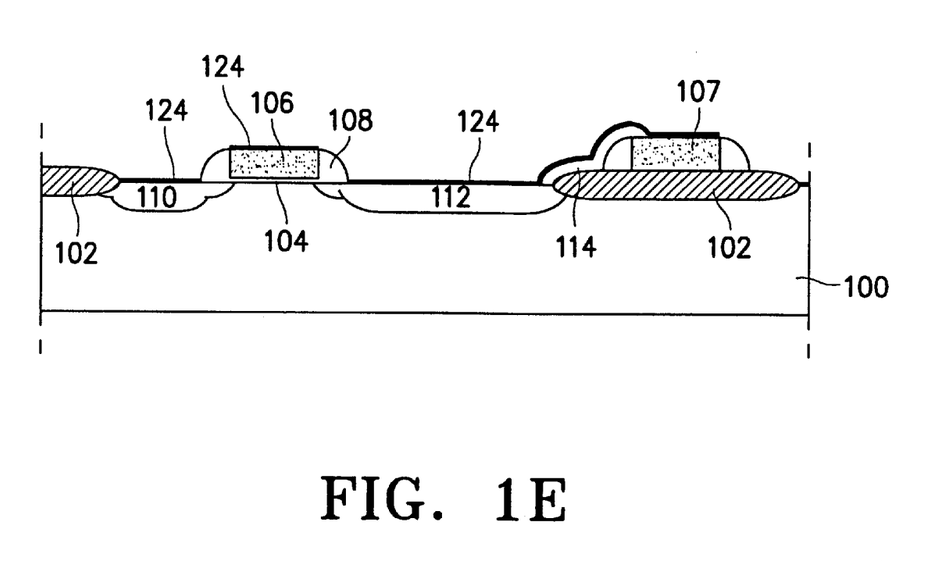

FIG. 1E illustrates the step of forming a titanium silicide layer 124. The semiconductor substrate 100 having the titanium layer 122 formed thereon is subjected to thermal treatment in a nitrogen atmosphere, preferably for about 30 seconds at about 700° C. As a result, the titanium silicide layer 124 is formed over the source region 110 containing single crystalline silicon, the gate region 106, and the area from the drain region 112 through the polysilicon layer 107. As is noted from this, the formation of a silicide over an area containing silicon without an extra mask is termed a salicide process. Finally, the semiconductor memory device is completed by removing an unreacted portion of the titanium layer 122 avoiding silicidation.

According to the first embodiment for electrically connecting a transistor with a portion of another device, there is no need for photolithography which is performed in the conventional method in order to partially remove titanium nitride without damaging the titanium silicide formed over a diffusion region and a polysilicon layer, while leaving the titanium nitride between the diffusion region and the polysilicon layer. Further, the present invention obviates the need for the deposition of amorphous silicon over a titanium layer and the photolithography of partially removing the amorphous silicon from a photoresist film-free area without damaging the titanium layer.

FIGS. 2A to 2E are sectional views sequentially illustrating a semiconductor device manufacturing process according to a second preferred embodiment of the present invention.

Figure 2A:
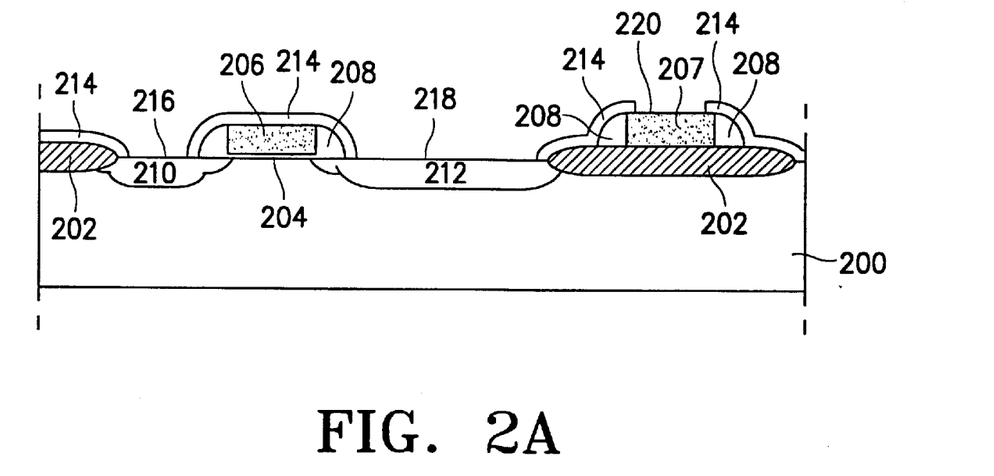
FIGS. 2A to 2E are sectional views sequentially illustrating a semiconductor device manufacturing process according to a second preferred embodiment of the present invention.

FIG. 2A illustrates the step of forming an insulating layer 214 over a semiconductor substrate 200 having a transistor and a polysilicon layer 207 formed thereon. A gate region 206 of the transistor is formed over an active region defined by a device isolation film 202 on the semiconductor substrate 200. A source region 210 and a drain region 212 are formed at opposite sides of the gate region 206, thereby completing the transistor. A polysilicon layer 207 is formed over the device isolation film 202, for interconnecting with the drain region 212 of the transistor. The polysilicon layer 207 may be a polysilicon gate that is part of an adjacent transistor (not shown in FIG. 2A). The insulating layer 214 is formed over the overall surface of the resultant structure and is removed from the source/drain regions 210 and 212 and the polysilicon layer 207. Thus, the surfaces 216, 218, and 220 of the source/drain regions 210 and 212 and the polysilicon layer 207 are exposed. While the insulating layer is removed from the drain region of the transistor and the polysilicon layer in the first embodiment, the insulating layer 214 is additionally removed from the source region 210 of the transistor so that a silicide-forming silicon is also formed over the source region in a subsequent step and thus loss of silicon on the source region 210 is minimized during a salicide process.

Figure 2B:
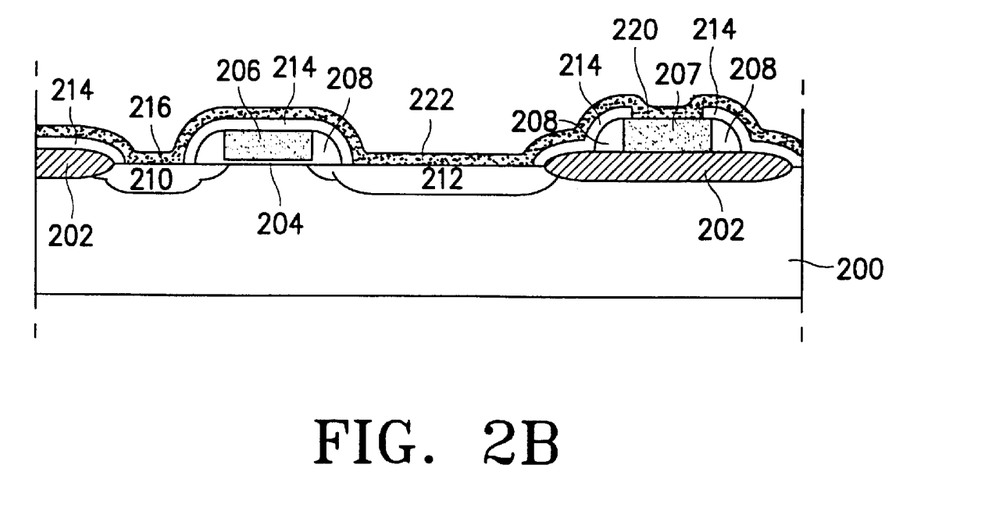

FIG. 2B illustrates the step of depositing a silicon layer 222 over the overall surface of the semiconductor substrate 100 having the surfaces 216, 218, and 220 of the source/drain regions 210 and 212 and the polysilicon layer 207 exposed. Preferably, the silicon layer 218 is formed of either single crystalline silicon, polysilicon, or amorphous silicon.

Figure 2C:
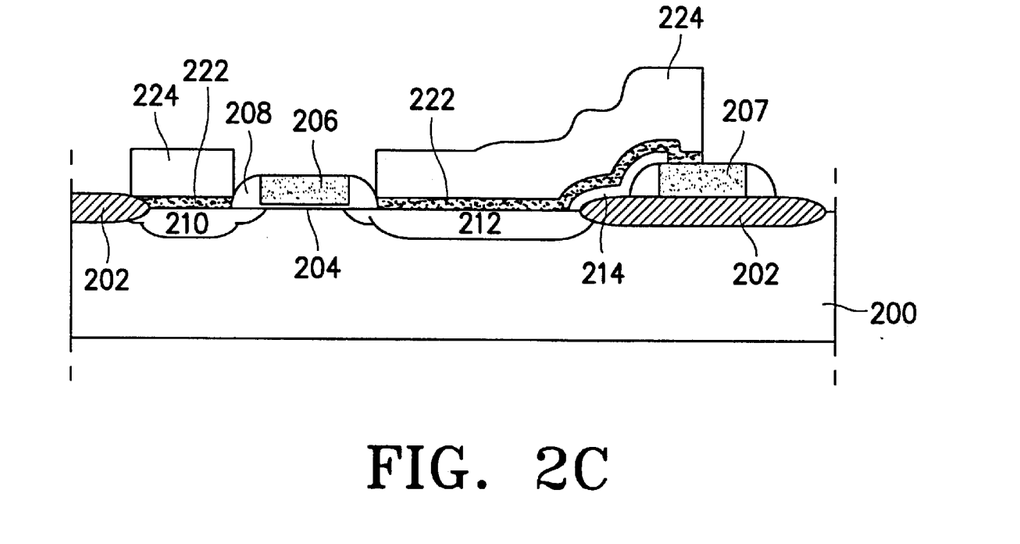

FIG. 2C illustrates the step of forming a photoresist film 224 over the silicon layer 222 and patterning the photoresist film 224 to remain only over the source region 210 and the area from the drain region 212 through a portion of the polysilicon layer 207. With the patterned photoresist film 224 used as an etching mask, the silicon layer 222 is removed from the photoresist film-free area.

Figure 2D:
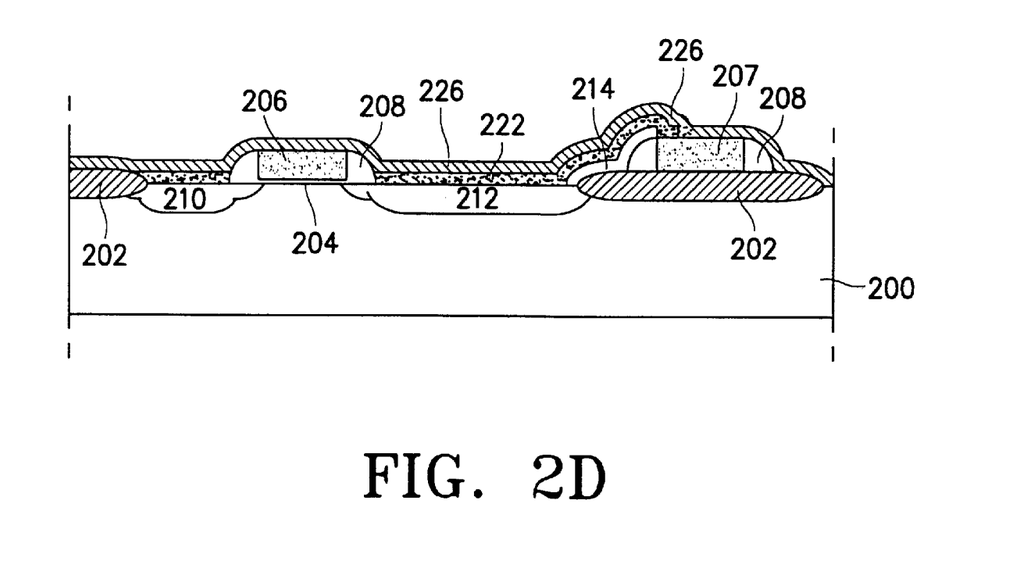

FIG. 2D illustrates the step of forming a metal thin film 226 over the overall surface of the semiconductor substrate 200. After the patterned photoresist film 224 is entirely removed, the metal thin film 226 is formed over the overall surface of the resultant structure. The metal thin film 226 is preferably formed of a refractory metal for forming a silicide by thermal treatment, such as titanium, cobalt, or tungsten.

In forming a silicide out of titanium and silicon, a silicon layer should preferably be about 2 to 2.2 times thicker than a titanium layer. Thus, assuming that a titanium layer is about 20 nm thick, the silicon layer 222 is preferably about 40 through 44 nm thick. On the other hand, in forming the silicide out of cobalt and silicon, a silicon layer is preferably about 3.2 to 3.4 times thicker than a cobalt layer. Therefore, the thickness of the silicon layer 222 is preferably about 64 to 68 nm thick for a cobalt layer of about 20 nm thickness.

Figure 2E:
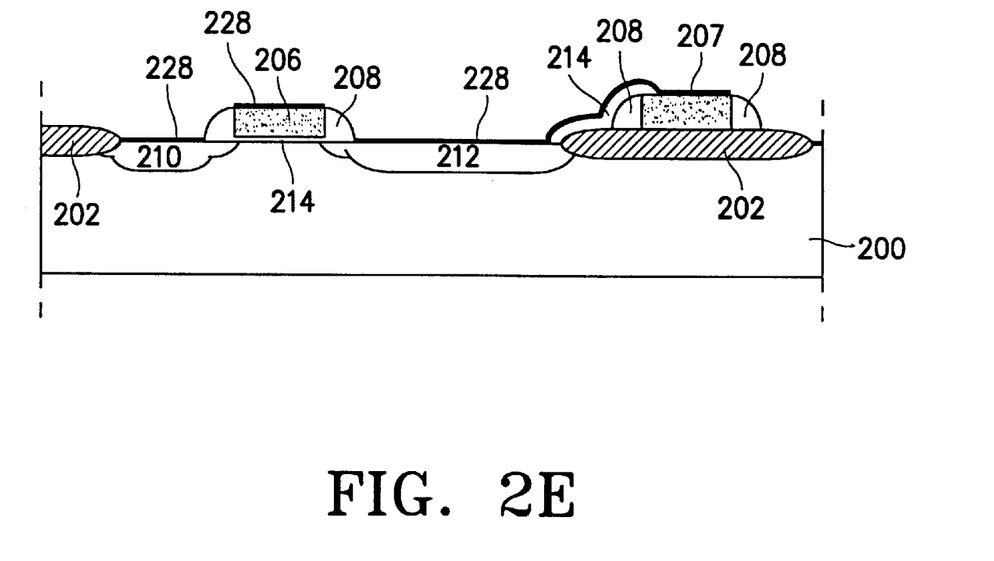

FIG. 2E illustrates the step of forming a silicide layer 228. The semiconductor substrate 100 having the metal thin film 226 formed thereon is subjected to thermal treatment, preferably in a nitrogen atmosphere for about 30 seconds. As a result, the silicide layer 228 is formed over the source region 210, the gate region 206, and the area from the drain region 212 through the polysilicon layer 207. Finally, the semiconductor memory device is completed by removing the metal thin film 226 remaining over the area free of the silicon layer 222, i.e., over the spacers 208 of the gate region 206 and one spacer 208 of the polysilicon layer 207.

According to the second embodiment for electrically connecting a transistor to a portion of another device, there is no need for photolithography that is performed in the conventional method in order to partially remove a titanium silicide formed over a diffusion region and a polysilicon layer, while leaving titanium nitride between the diffusion region and the polysilicon layer. Further, the present invention obviates the need for the deposition of amorphous silicon over titanium and the photolithography of partially removing the amorphous silicon from a photoresist film-free area without damaging the titanium. The second embodiment is different from the first embodiment in that silicon loss of the source region is minimized by forming a silicon layer and thus a silicide also over the source region. As a result, the junction leakage of the source region, which may be encountered in the first embodiment, is overcome, thereby enabling fabrication of a highly reliable semiconductor device.

As described above, the present invention relieves difficulties involved in fine patterning and deposition and removal of a silicon layer needed for forming a silicide layer in an interconnection process for connecting conductive layers to each other. Another advantage of the present invention is that the junction of a conductive layer to be provided as an ion-implanted active region can be minimized.

While the present invention has been described in detail with reference to the above specific embodiments, they are mere exemplary applications. Thus, it is to be clearly understood that many variations can be made by anyone skilled in the art within the scope and spirit of the present invention.

What is claimed is:

1. A method for manufacturing a semiconductor device, the method comprising:

forming first and second transistors on an active region of a semiconductor substrate, the first and second transistors being adjacent to each other;

forming an insulating layer over the semiconductor substrate and the first and second transistors;

removing the insulating layer from over a diffusion region of the first transistor and over a gate of the second transistor;

coating a silicide-forming silicon over the semiconductor substrate, the insulating layer, and the first and second transistors;

forming a photoresist film over a first area from the diffusion region of the first transistor to the gate of the second transistor;

removing exposed portions of the silicide-forming silicon and the insulating layer not in the first area, such that a remaining portion of the silicide-forming silicon covers substantially all of the diffusion region of the first transistor, leaving none of the diffusion region exposed;

removing the photoresist film;

forming a metal layer over the semiconductor substrate, the insulating layer, and the first and second transistors;

forming a silicide layer in the first area by thermally treating the metal layer; and removing any remaining metal layer after the step of forming a suicide layer, whereby the diffusion region of the first transistor is connected to the gate of the second transistor by the silicide layer.

2. A method for manufacturing a semiconductor device, as recited in claim 1, wherein the diffusion region of the first transistor is a drain region.

3. A method for manufacturing a semiconductor device, as recited in claim 2, wherein the step of removing an insulating layer also removes an insulating layer from over a source region of the first transistor.

4. A method for manufacturing a semiconductor device, as recited in claim 3, wherein in the first area also includes an area over the source region of the first transistor.

5. A method for manufacturing a semiconductor device, as recited in claim 1, wherein the gate of the second transistor is a polysilicon layer formed over a field oxide film.

6. A method for manufacturing a semiconductor device, as recited in claim 1, wherein the insulating layer is chosen from the group consisting of a n oxide film and a nitride film.

7. A method for manufacturing a semiconductor device, as recited in claim 1, wherein the metal layer is formed of a refractory metal selected from the group consisting of titanium, tungsten, cobalt, and molybdenum.

8. A method for manufacturing a semiconductor device, as recited in claim 1, wherein the silicide-forming silicon is formed of one of a single crystalline silicon, a polysilicon, and an amorphous silicon.

9. A method for manufacturing a semiconductor device, comprising:

forming a first conductive layer acting as a source/drain region of a transistor disposed between a field oxide film and a second conductive layer over a semiconductor substrate;

forming an insulating layer over the semiconductor substrate and the first and second conductive layers;

removing the insulating layer from over the first and second conductive layers;

coating a silicon layer over the semiconductor substrate and the first and second conductive layers;

removing a second portion of the silicon layer such that a first portion of the silicon layer remains over a first area from the first conductive layer through the second conductive layer, and that the first portion of the silicon layer covers substantially all of the source/drain region, leaving none of the source/drain region exposed;

forming a refractory metal layer over the semiconductor substrate, the first and second conductive layers, and the first portion of the silicon layer; and forming a metal silicide layer over the first area by thermally treating the refractory metal layer, whereby the first conductive layer is connected to the second conductive layer by the metal silicide layer.

10. A method for manufacturing a semiconductor device, as recited in claim 9, wherein the refractory metal layer is formed a material from the group consisting of titanium, tungsten, cobalt, and molybdenum.

11. A method for manufacturing a semiconductor device, as recited in claim 9, wherein the insulating layer is chosen from the group consisting of an oxide film and a nitride film.

12. A method for manufacturing a semiconductor device, as recited in claim 9, wherein the silicide-forming silicon is formed of one of a single crystalline silicon, a polysilicon, and an amorphous silicon.

13. A method for manufacturing a semiconductor device, as recited in claim 9, wherein the second conductive layer is formed on the field oxide film.

14. A method for manufacturing a semiconductor device, comprising:

forming a first transistor including a diffusion region of a second conductivity type over an active region of a semiconductor substrate of a first conductivity type;

forming a second transistor including a gate of the second conductivity type adjacent to the first transistor over the active region of the semiconductor substrate;

forming an insulating layer over the semiconductor substrate and the first and second transistors;

removing the insulating layer from over the diffusion region of the first transistor and over the gate of the second transistor;

coating a silicide-forming silicon over the semiconductor substrate, the first and second transistors, and the insulating layer;

forming a photoresist film over a first area from the diffusion region of the first transistor through the gate of the second transistor;

removing exposed portions of the silicide-forming silicon and the insulating layer not in the first area, such that a remaining portion of the silicide-forming silicon covers substantially all of the diffusion region of the first transistor, leaving none of the diffusion region exposed;

removing the photoresist film;

forming a metal layer over the semiconductor substrate, the first and second transistors, the insulating layer, and the silicide-forming silicon;

forming a silicide layer over the first area by thermally treating the metal layer; and removing the remaining metal layer after the step of forming a silicide layer, whereby the diffusion region of the first transistor is connected to the gate of the second transistor by the silicide layer.

15. A method for manufacturing a semiconductor device, as recited in claim 14, wherein the gate of the second transistor is a polysilicon layer formed over a field oxide film.

16. A method for manufacturing a semiconductor device, as recited in claim 14, wherein the insulating layer is chosen from the group consisting of an oxide film and a nitride film.

17. A method for manufacturing a semiconductor device, as recited in claim 14, wherein the metal layer is formed of a refractory metal selected from the group consisting of titanium, tungsten, cobalt, and molybdenum.

18. A method for manufacturing a semiconductor device, as recited in claim 14, wherein the silicide-forming silicon is formed of one of a single crystalline silicon, a polysilicon, and an amorphous silicon.

* * * * *